United States Patent
Harazono et al.

(10) Patent No.: US 10,306,769 B2
(45) Date of Patent: May 28, 2019

(54) WIRING BOARD AND MANUFACTURING METHOD FOR SAME

(71) Applicant: KYOCERA Corporation, Kyoto-shi, Kyoto (JP)

(72) Inventors: Masaaki Harazono, Kirishima (JP); Takayuki Umemoto, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/715,921

(22) Filed: Sep. 26, 2017

(65) Prior Publication Data

US 2018/0146558 A1 May 24, 2018

(30) Foreign Application Priority Data

Nov. 22, 2016 (JP) ................. 2016-226422

(51) Int. Cl.
| | |
|---|---|
| *H05K 3/18* | (2006.01) |
| *H05K 1/02* | (2006.01) |
| *H05K 3/00* | (2006.01) |
| *H05K 3/10* | (2006.01) |
| *H05K 3/46* | (2006.01) |

(52) U.S. Cl.
CPC ............. *H05K 3/18* (2013.01); *H05K 1/024* (2013.01); *H05K 1/0242* (2013.01); *H05K 1/0251* (2013.01); *H05K 3/0041* (2013.01); *H05K 3/107* (2013.01); *H05K 3/4644* (2013.01); *H05K 2201/0209* (2013.01)

(58) Field of Classification Search
CPC .................................................... H05K 3/3452
USPC ......................................................... 174/250
See application file for complete search history.

(56) References Cited

U.S. PATENT DOCUMENTS

| | | | |
|---|---|---|---|
| 2011/0232953 A1* | 9/2011 | Oga ...................... | H05K 3/4602 174/258 |
| 2011/0247860 A1* | 10/2011 | Yoshioka ............... | H05K 3/107 174/250 |
| 2012/0074094 A1* | 3/2012 | Chiang ............... | H01L 21/4846 216/18 |
| 2012/0216946 A1* | 8/2012 | Hondo .................. | H05K 3/205 156/182 |
| 2013/0192882 A1* | 8/2013 | Nejime .................. | H05K 1/036 174/255 |
| 2015/0368518 A1* | 12/2015 | Kawai ..................... | H05K 3/46 156/247 |
| 2016/0353570 A1* | 12/2016 | Lee ....................... | H05K 1/0373 |

FOREIGN PATENT DOCUMENTS

JP  2000-174421 A  6/2000

* cited by examiner

*Primary Examiner* — Stanley Tso
(74) *Attorney, Agent, or Firm* — Volpe and Koenig, P.C.

(57) ABSTRACT

A wiring board includes an insulating layer made of an insulating resin containing inorganic insulating particles, a groove positioned in a surface of the insulating layer and including a wall surface being perpendicular to the surface of the insulating layer, and a wiring conductor filled in the groove, wherein a cross-section of the insulating resin and cross-sections of the inorganic insulating particles are exposed at the wall surface in flush with each other.

2 Claims, 3 Drawing Sheets

WIRING BOARD AND MANUFACTURING METHOD FOR SAME

BACKGROUND OF THE INVENTION

1. Technical Field

The present disclosure relates to a wiring board including fine wirings with a high density, and to a manufacturing method for the wiring board.

2. Background

A related-art wiring board including fine wirings with a high density includes an insulating layer serving as a core, an insulating layer for buildup, a wiring conductor, and a solder resist layer. A mounting portion where a semiconductor element is to be mounted is positioned in a central region of an upper surface of the wiring board (see Japanese Unexamined Patent Application Publication No. 2000-174421).

Recently, a shift of a transmission signal toward an even higher frequency range has been progressed with more sophistication of electronic devices represented by portable communication devices and music players. Such a high frequency signal exhibits the so-called skin effect, i.e., properties that the high frequency signal propagates mainly along a surface of the wiring conductor.

SUMMARY OF THE INVENTION

A wiring board according to the present disclosure includes an insulating layer made of an insulating resin containing inorganic insulating particles, a groove formed in a surface of the insulating layer and including a wall surface being perpendicular to the surface of the insulating layer, and a wiring conductor filled in the groove, wherein a cross-section of the insulating resin and cross-sections of the inorganic insulating particles are exposed at the wall surface in flush with each other.

A manufacturing method for a wiring board according to the present disclosure includes steps of forming, in a surface of an insulating layer made of an insulating resin containing inorganic insulating particles, a groove including a wall surface being perpendicular to the surface of the insulating layer, and filling a wiring conductor in the groove, the manufacturing method further including steps of coating, over the surface of the insulating layer, a resist including an opening corresponding to a wiring pattern, forming the groove with dry etching carried out from above the resist to etch away the insulating layer in the opening up to a predetermined depth, removing the resist, and filling the wiring conductor in the groove.

DETAILED DESCRIPTION

Figure 1:
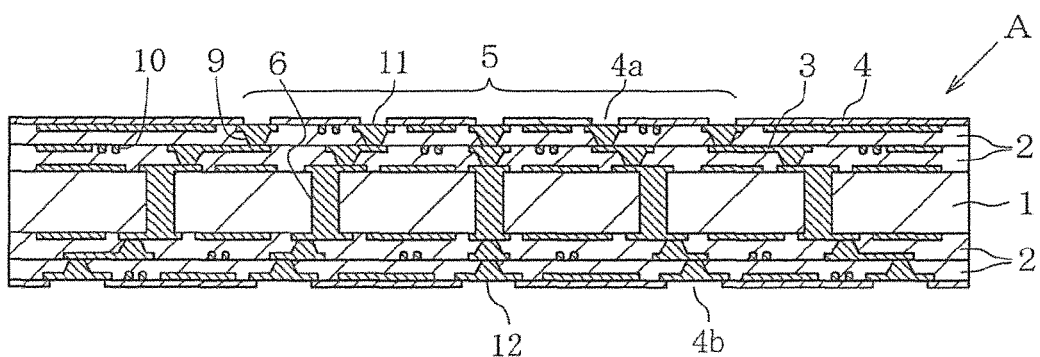
FIG. 1 is a schematic sectional view illustrating an exemplary embodiment of a wiring board according to the present disclosure.

An exemplary embodiment of a wiring board A according to the present disclosure will be described below with reference to FIGS. 1 and 2.

The wiring board A according to the present disclosure includes an insulating layer 1 serving as a core, insulating layers 2 for buildup, wiring conductors 3, and solder resist layers 4. A mounting portion 5 where a semiconductor element is to be mounted is positioned in a central region of an upper surface of the wiring board A.

The insulating layer 1 serving as the core includes an insulating material that is formed, for example, by impregnating a piece of glass cloth with an epoxy resin, a bismaleimide triazine resin or the like, and by thermally solidifying the glass cloth. The insulating layer 1 serving as the core includes a plurality of through-holes 6 penetrating the insulating layer 1 vertically. The through-holes 6 are formed, for example, by drilling, laser processing, or blasting.

Figure 2:
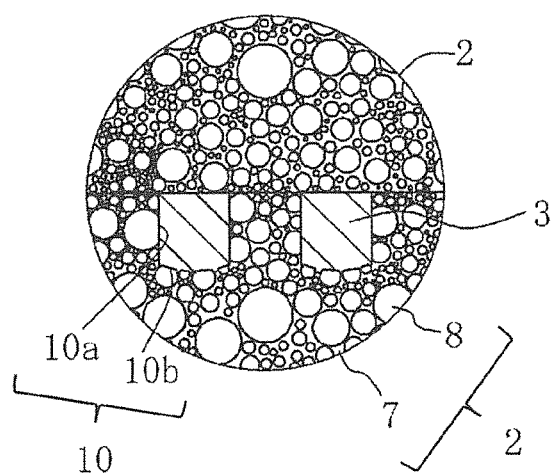
FIG. 2 is an enlarged schematic sectional view of principal part of the wiring board according to the present disclosure.

As illustrated in FIG. 2, by way of example, each of the insulating layers 2 for buildup contains an insulating material that is formed by dispersing inorganic insulating particles 8, such as silica, in an insulating resin 7, such as an epoxy resin, a bismaleimide triazine resin, or a polyimide resin, and by thermally solidifying the insulating resin 7. Each insulating layer 2 includes a plurality of via holes 9 penetrating the insulating layer 2 from an upper surface to a lower surface thereof. The via holes 9 are formed, for example, by dry etching or laser processing. FIG. 2 is an enlarged schematic sectional view of principal parts of the two insulating layers 2 and 2 laminated one above the other.

Grooves 10 are positioned in a surface of the insulating layer 2 for buildup (in an upper surface of the insulating layer 2 in FIGS. 1 and 2). The wiring conductors 3 for transmitting a high frequency signal are filled in the grooves 10. A cross-section of the insulating resin 7 and cross-sections of the inorganic insulating particles 8 are exposed at wall surfaces 10a of the grooves 10 in flush with each other. Therefore, the wall surfaces 10a of the grooves 10 are flat. Bottom surfaces 10b of the grooves 10 have an irregularly shape formed by the inorganic insulating particles 8 projecting out from the insulating resin 7. The content of the inorganic insulating particles 8 in the insulating layer 2 for buildup is about 40 to 80% by mass, for example.

The grooves 10 are formed, for example, by dry etching using mixed gas of carbon tetrafluoride and oxygen. After the dry etching, a removal treatment using plasma processing or an alkaline solution, for example, is carried out to remove an altered layer of the insulating resin 7, the altered layer having being generated with the dry etching. Adhesion force between the wiring conductor 3 and the bottom surface of the groove 10 is increased as a result of removing the altered layer.

The wiring conductors 3 are positioned not only at the surface of the insulating layer 1 serving as the core and the surface of the insulating layer 2 for buildup, but also within the through-holes 6, the via-holes 9, and the grooves 10. Part of each wiring conductor 3 positioned at the surface of the uppermost insulating layer 2 for buildup functions as a semiconductor element connection pad 11 to be connected to a semiconductor element. Part of each wiring conductor 3 positioned at the surface of the lowermost insulating layer 2 for buildup functions as an external connection pad 12 to be connected to an external circuit board.

The wiring conductors 3 in the insulating layer 2 for buildup are formed, by way of example, as follows. First, the insulating layer 2 for buildup is prepared in such a state that an underlying metal layer is coated over the surface of the insulating layer 2, and a resist including openings corresponding to a wiring pattern is coated over a surface of the underlying metal layer. Then, the grooves 10 are formed by dry etching carried out from above the resist, and by etching away portions of the insulating layer 2, those portions being exposed at the openings, up to a predetermined depth. After removing the resist and coating an underlying metal layer on inner surfaces of the grooves 10, electrolytically plated copper is deposited in the grooves 10. Finally, the wiring conductors are formed by removing the electrolytically plated copper extending out from the grooves 10 and the underlying metal layer coated between the grooves 10. The insulating layer 2 for buildup, including the wiring conductors 3 formed therein, is previously bonded to one surface or both surfaces of the insulating layer 1 serving as the core.

The solder resist layers 4 are each positioned on the surface of the outermost insulating layer 2 for buildup. Each solder resist layer 4 contains a thermosetting resin such as a polyimide resin. The solder resist layer 4 on the upper surface side includes openings 4a where the semiconductor element connection pads 11 are exposed. The solder resist layer 4 on the lower surface side includes openings 4b where the external connection pads 12 are exposed. A semiconductor element is electrically connected to the external circuit board by connecting electrodes of the semiconductor element to the semiconductor element connection pads 11, and by connecting the external connection pads 12 to electrodes of the external circuit board.

In the wiring board A of this exemplary embodiment, the wall surfaces 10a of the grooves 10 filled with the wiring conductors 3 are constituted by flat surfaces in which the cross-section of the insulating resin 7 and the cross-sections of the inorganic insulating particles 8 are exposed in flush with each other. It is hence possible to ensure a path allowing the high frequency signal to propagate efficiently therethrough, and to provide the wiring board with good transmission characteristics for the high frequency signal.

Meanwhile, according to the related-art technique, a wiring conductor is formed of a highly conductive metal, such as plated copper, by employing the so-called semi-additive process, for example. According to the semi-additive process, a wiring is formed by coating a plating resist, the resist including openings corresponding to a wiring pattern, over a surface of an insulating layer coated with non-electrolytically plated copper, depositing electrolytically plated copper on a surface of the non-electrolytically plated copper exposed at the openings, peeling off the plating resist, and then etching away the non-electrolytically plated copper remaining between regions of the electrolytically plated copper.

Figure 3:
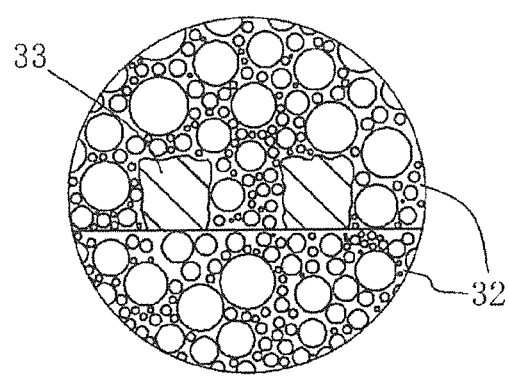
FIG. 3 is an enlarged schematic sectional view of principal part of a usual wiring board.

In the above-described step of removing the non-electrolytically plated copper, as illustrated in FIG. 3, surfaces of wiring conductors 33 formed on a surface of an insulating layer 32 are also etched at the same time, and the surfaces of the wiring conductors 33 may have an irregularly shape in some cases. This reduces flat surfaces along which the high frequency signal propagates, and causes a difficulty in efficiently transmitting the high frequency signal.

Additionally, in the exemplary embodiment of the present disclosure, the bottom surfaces 10b of the grooves 10 are formed as irregular surfaces with the inorganic insulating particles 8 projecting out from the insulating resin 7. As a result, the wiring conductors 3 are positively fixed in the grooves 10 with the so-called anchoring effect.

The present disclosure is not limited to the above-described embodiment, and the present disclosure can be variously modified insofar as not departing from the scope of the present disclosure.

What is claimed is:

1. A wiring board comprising:
   an insulating layer made of an insulating resin containing inorganic insulating particles;
   a groove positioned in a surface of the insulating layer and including two side walls and a bottom wall; the two side walls having a surface that is smooth, and a bottom wall surface comprising the inorganic insulating particles projecting out from the insulating resin so as to form an irregular shape, wherein a cross-section of the inorganic insulating particles on the two side walls and a cross-section of the insulating resin on the two side walls are exposed in flush with each other; and
   a wiring conductor filled in the groove so as to be in contact with the two side walls and the bottom wall surface,
   wherein a cross-section of the insulating resin and cross-sections of the inorganic insulating particles are exposed on the bottom wall surface and are in contact with the wiring conductor,
   wherein the groove is formed by dry etching using carbon tetrafluoride and oxygen gases and by a removal treatment using plasma processing or an alkaline solution.

2. The wiring board according to claim 1, wherein a content of the inorganic insulating particles in the insulating layer is 40 to 80% by mass.

* * * * *